United States Patent [19]

Margalit et al.

[11] Patent Number: 4,620,214
[45] Date of Patent: Oct. 28, 1986

[54] MULTIPLE QUANTUM-WELL INFRARED DETECTOR

[75] Inventors: Shlomo Margalit, Pasadena; Liew-Chuang Chiu, Milford; John S. Smith, Pasadena; Amnon Yariv, San Marino, all of Calif.

[73] Assignee: California Institute of Technology, Pasadena, Calif.

[21] Appl. No.: 557,594

[22] Filed: Dec. 2, 1983

[51] Int. Cl.⁴ .................... H01L 29/167; H01L 27/14
[52] U.S. Cl. ........................................ 357/63; 357/30; 357/16; 357/4; 357/13
[58] Field of Search ............... 357/16, 4, 30, 63, 13

[56] References Cited

U.S. PATENT DOCUMENTS

| | | | |
|---|---|---|---|
| 3,801,391 | 4/1974 | Dyment et al. | 357/16 |
| 4,071,383 | 1/1978 | Nagata et al. | 357/16 |
| 4,127,862 | 11/1978 | Ilegems et al. | 357/16 |
| 4,203,124 | 5/1980 | Gordon | 357/13 |
| 4,250,516 | 2/1981 | Worlock | 357/30 |
| 4,386,429 | 5/1983 | Anthony | 357/16 |
| 4,450,463 | 5/1984 | Chin | 357/4 |
| 4,486,765 | 12/1984 | Capasso | 357/13 |

OTHER PUBLICATIONS

Applied Physics Letters, vol. 36 #5, Mar. 1980, pp. 373–375, by Allyn et al.

Primary Examiner—Andrew J. James
Assistant Examiner—Mark Prenty
Attorney, Agent, or Firm—Freilich, Hornbaker, Rosen & Fernandez

[57] ABSTRACT

Alternating layers of N+GaAs (80Å) and N+ $Ga_{1-x}Al_xAs$ (300 Å), all heavily doped with a uniform flux of Sn, and biased by 2V, provide a multiple quantum-well heterojunction structure for infrared detection with cutoff wavelength established by the choice of the value x which defines the depth of the wells. Fine tuning of the cutoff wavelength may be achieved by varying the bias voltage. By biasing the individual quantum-well layers progressively through a voltage divider, an avalanche mechanism may be achieved in the detector for signal amplification. The detectors may be fabricated in large two-dimensional arrays.

2 Claims, 9 Drawing Figures

MULTIPLE QUANTUM-WELL INFRARED DETECTOR

ORIGIN OF INVENTION

The work resulting in this invention was supported by the National Science Foundation (Grant No. ECS-7909972), Office of Naval Research (Contract No. NOOO14-76-C-0322) and the Army Research Office (Contract No. DAAG29-83-K-0048).

BACKGROUND OF THE INVENTION

This invention relates to photodetectors which will respond to light of wavelengths extending beyond the red end of the visible spectrum into the near infrared, and more particularly to application of internal photoemission from quantum-well structures to such infrared detectors.

The advent of molecular beam epitaxy makes possible the growth of ultrathin crystal layers of high quality, and therefore the fabrication of devices with complicated band structures and a high degree of control over important parameters such as doping profiles, band discontinuities, and layer thicknesses. High quality large-area wafers may be grown with layer thickness control of a few angstroms. An object of this invention is to provide a new type of infrared photodetector which allows this high degree of control to enable the tailoring of such characteristics as its cutoff wavelength and the tradeoff between its photoconductive gain and response time.

SUMMARY OF THE INVENTION

In accordance with the present invention, an infrared photodetector is provided in a heavily doped multiple quantum-well structure formed by alternating layers of two semiconductor materials which form heterojunctions with a conduction or valence-band discontinuity of the desired magnitude. This forms a quantum well in the conduction or valance band in the layers formed by the lower bandgap material. The quantum wells are formed, for example, by epitaxial growth of multiple N+ GaAs layers about 80 Å thick separated by barrier layers of $N^+Ga_{1-x}AL_xAs$ about 300 Å thick. Upper and lower claddings of $Ga_{1-y}Al_yAs$ (y>x) may be grown to provide an optical waveguide where the device is to be used as an edge detector. For a surface detector, the structure would be as described for the edge detector except that the claddings would not be required, and a thick quantum-well structure would be needed due to the long absorption length of photons. In both cases, upper and lower ohmic contacts are provided to so bias the multiple quantum-well structure as to slope the Fermi level, thereby progressively lower the top edges of said quantum wells for flow of current in an external circuit in response to electrons excited out of the quantum wells by photons of sufficient energy. In the case of the surface detector, a transparent or partially transparent contact would be used to allow passage of the infrared radiation. Free-carrier absorption excites electrons out of the quantum wells allowing current to flow in an external bias circuit.

The novel features of the invention are set forth with particularity in the appended claims. The invention will best be understood from the following description when read in connection with the accompanying drawings.

BRIEF DESCRIPTION OF THE DRAWINGS

FIG. 1b illustrates schematically a circuit for detection of photocurrent through the structure of FIG. 1a.

FIG. 3b is an isometric view of an edge detector utilizing the quantum-well structure of FIG. 3a.

FIG. 5b is a schematic diagram of the bias arrangement of FIG. 5a.

FIG. 5c illustrates an alternative way to provide the bias arrangement of FIG. 5a.

DESCRIPTION OF PREFERRED EMBODIMENTS

Figure 1A:
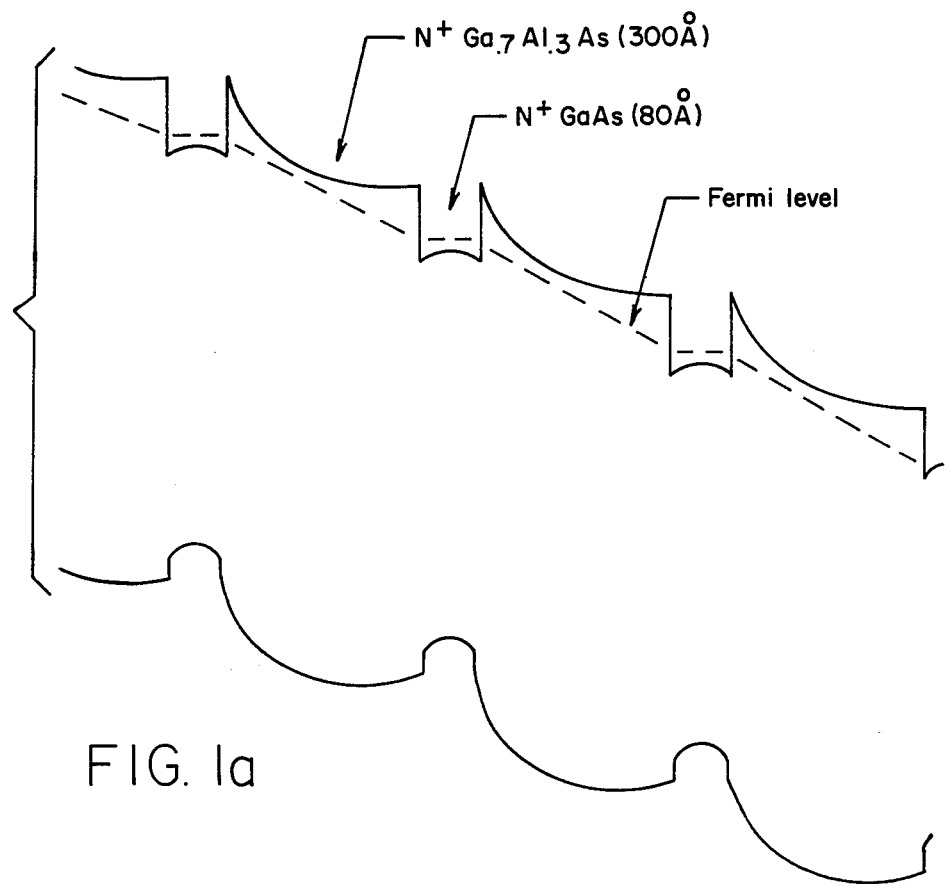
FIG. 1a illustrates a band diagram of a multiple quantum-well structure under an applied bias of 2 V.

The body of an infrared detector made in accordance with this invention is comprised of a heavily doped, multiple quantum-well structure formed by alternating layers of semiconductors, for example, $N^+GaAs$ and $N^+Ga_{1-x}Al_xAs$, which form heterojunctions with a conduction-band discontinuity of the desired magnitude. A typical band diagram for these materials in a device biased with 2 V is shown in FIG. 1. The device is operated at a temperature sufficiently low that nearly all of the electrons are trapped in the quantum wells. With the bias voltage applied across the structure, little current flows in the absence of light due to the lack of carriers outside the quantum wells of $N^+GaAs$ between layers of $N^+Ga_xAl_{1-x}As$.

The structure may be uniformly or modulation doped. The presence of donors in the quantum-well layers is not detrimental to the operation of the device. Free-carrier absorption excites electrons out of the quantum wells allowing current to flow in an external circuit, implemented as shown schematically in FIG. 1b, where a photodetector cell 10 comprised of this quantum-well structure is represented by a capacitor C in parallel with a resistor $R_1$ and in series with a resistor $R_2$ connected to a source of voltage, 2 V. An operational amplifier $A_1$ with a feedback resistor $R_3$ maintains the junction between the resistors $R_1$ and $R_2$ at virtual ground so that the quantum-well structure is biased by 2 V. For the purpose of this discussion, it is assumed an MOSFET switch, $Q_1$, shown in FIG. 1b is held on to connect the source of bias voltage to the cell 10. Biased in this manner, the quantum-well structure acts as a photoconductor, similar in some respects to extrinsic silicon and germanium devices, with the impurity traps of these devices corresponding to the quantum wells of the free electron absorption device.

The cutoff wavelength of this photodetector cell for a given bias is determined by the depth of the conduction-band quantum wells. Photons with less energy than that necessary to excite electrons out of the quantum wells will be absorbed, but these absorptions do not contribute to the detection current because the electrons thermalize back into the same quantum well.

The dark current of the device is due to the thermal excitation of electrons over the same barriers. If the device is fabricated with a lower barrier height, the cutoff wavelength will be increased, and the dark current at a given temperature will also increase. There is direct control of this tradeoff between cutoff wavelength, sensitivity, and cooling requirements of the device, simply by varying the aluminum mole fraction of the barrier regions. This control makes possible the fabrication of particular devices optimized for desired bands of interest, including the 3 to 5 micron band and the 8 to 10 micron band.

Figure 2:
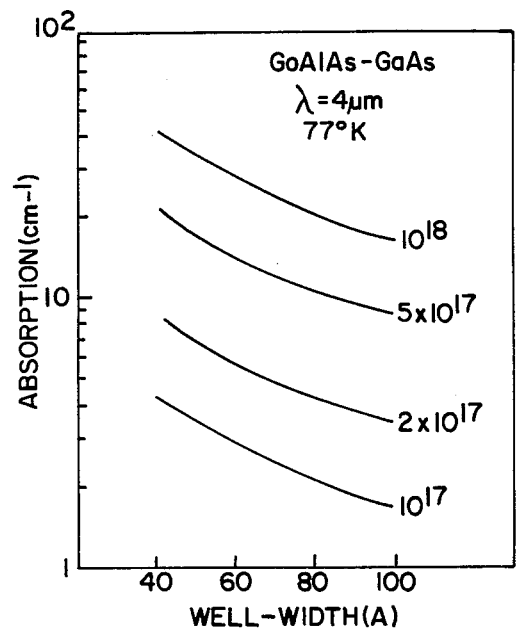
FIG. 2 is a graph of calculated coefficient of free electron absorption at 77 K for different electron concentrations.

The mechanism of this device is similar to that of the Schottky-barrier detector, with the metal replaced with a heavily doped semiconductor. The low density of electrons in the semiconductor, compared to that in a metal, is partially compensated by the large number of active interfaces in this structure. However, the total number of electrons participating in the absorption is still small compared to that in a metal. The free-carrier absorption in the quantum wells was also shown by the inventors to be enhanced over the bulk free-carrier absorption by a factor:

$$\frac{\alpha_{Q2D}}{\alpha_{3D}} \approx \frac{2\pi n^2}{m_c kT}^{\frac{1}{2}} \frac{N}{L},$$

where L is the width of the well and N is the number of confined states. Infrared Physics, Vol. 23, No. 2 pp 93-97, (1983). Calculated values of 77 K are shown in FIG. 2. In addition, phononless absorption is possible as described by the inventors in Appl. Phys. Lett. Vol. 43 No. 4, pp 331-332 (Aug. 15, 1983), which yields a much higher absorption.

To increase the sensitivity, the device demonstrated used a waveguide geometry, allowing more of the light to be absorbed due to the increased interaction length. Later results indicate that the absorption of the electrons within the quantum well may be enhanced sufficiently, compared to that of three-dimensional free electrons, so that the waveguide geometry may not be necessary for good sensitivity.

Figure 1B:
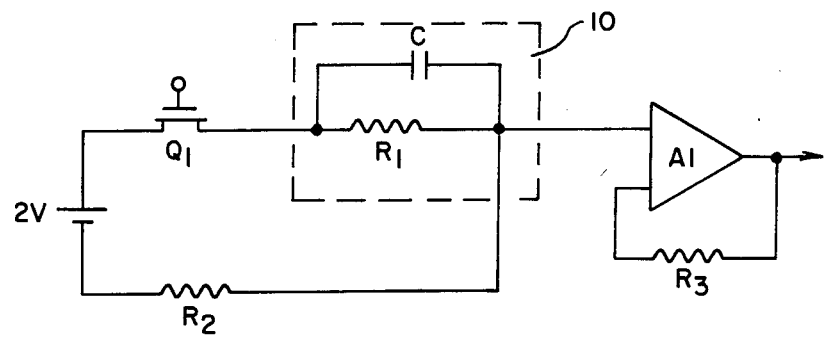
Figure 3A:
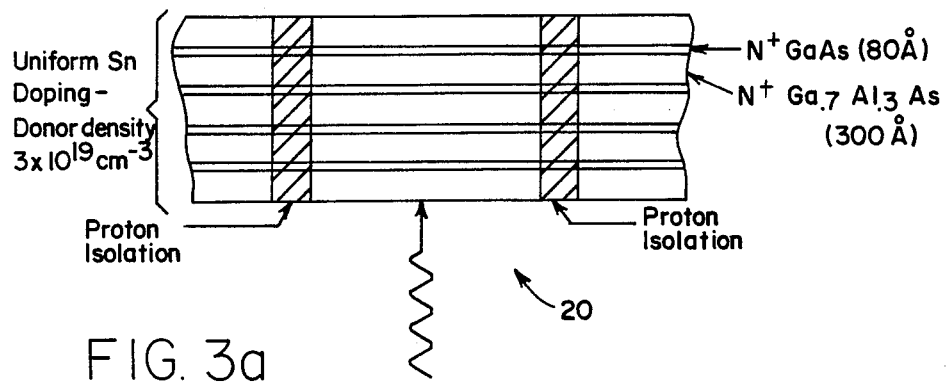
FIG. 3a is an enlarged end view of a quantum-well structure with cladding on both sides of $N^+Ga_{0.6}Al_{0.4}As$ forming a waveguide edge-detecting structure.

A quantum-well photodetector with a band diagram as shown in FIG. 1a which has been successfully tested was comprised of a structure 20 shown in FIG. 3a that consisted of alternating layers of N+GaAs epitaxially grown to about 80 Å and barrier layers of N+Ga$_{1-x}$Al$_x$As (x=0.3) epitaxially grown to about 300 Å, all heavily doped with a uniform flux of Sn, providing a donor density of approximately $3 \times 10^{19}$ cm$^{-3}$. Due to the aluminum effusion cell being operated at a constant current rather than a constant temperature, the aluminum layers were graded slightly. This was anticipated and was expected to enhance electron transport in the direction of the grading, from left to right in the bandgap diagram of FIG. 1a.

Figure 3B:
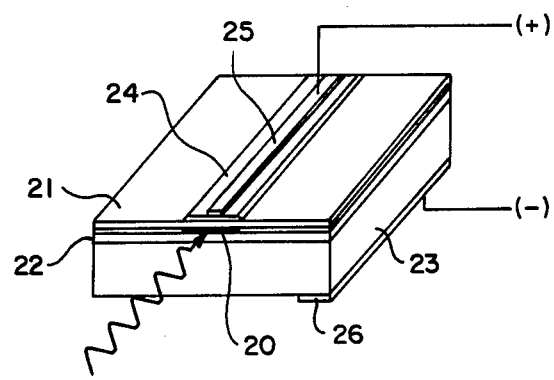

Upper and lower claddings 21 and 22 Ga$_{1-y}$Al$_y$As (y=0.4) were grown to provide an optical waveguide, as shown in FIG. 3b where the quantum-well structure of FIG. 3a is represented by a solid bar also identified by the reference numeral 20. The cladding thickness may be substantially greater than the total multiple quantum-well structure for support of the structure. The device was grown on a N+GaAs wafer 23, and a 2000 Å N+GaAs contact layer 24 was used on top to provide ohmic contact at the low operating temperatures.

After the growth was completed, the wafer was removed from the mounting block and the back was lapped to remove the indium solder and allow photolithography. Transverse isolation channels were provided by etching away the contact layer 24 and part of the upper cladding outside of a 15-micron stripe. Silicon nitride was then deposited by chemical vapor deposition, openings were etched over the previously etched mesas, and AuGe/Au contacts 25 and 26 were alloyed to the top strip 24 and bottom of the wafer 23. The wafer was cleaved in bars to provide a geometry similar to that of a stripe contact double heterostructure laser, to be used as an edge detector. The completed device had a receiving aperture of 0.5 by 15 microns, and an interaction length of 150 microns.

Figure 4:
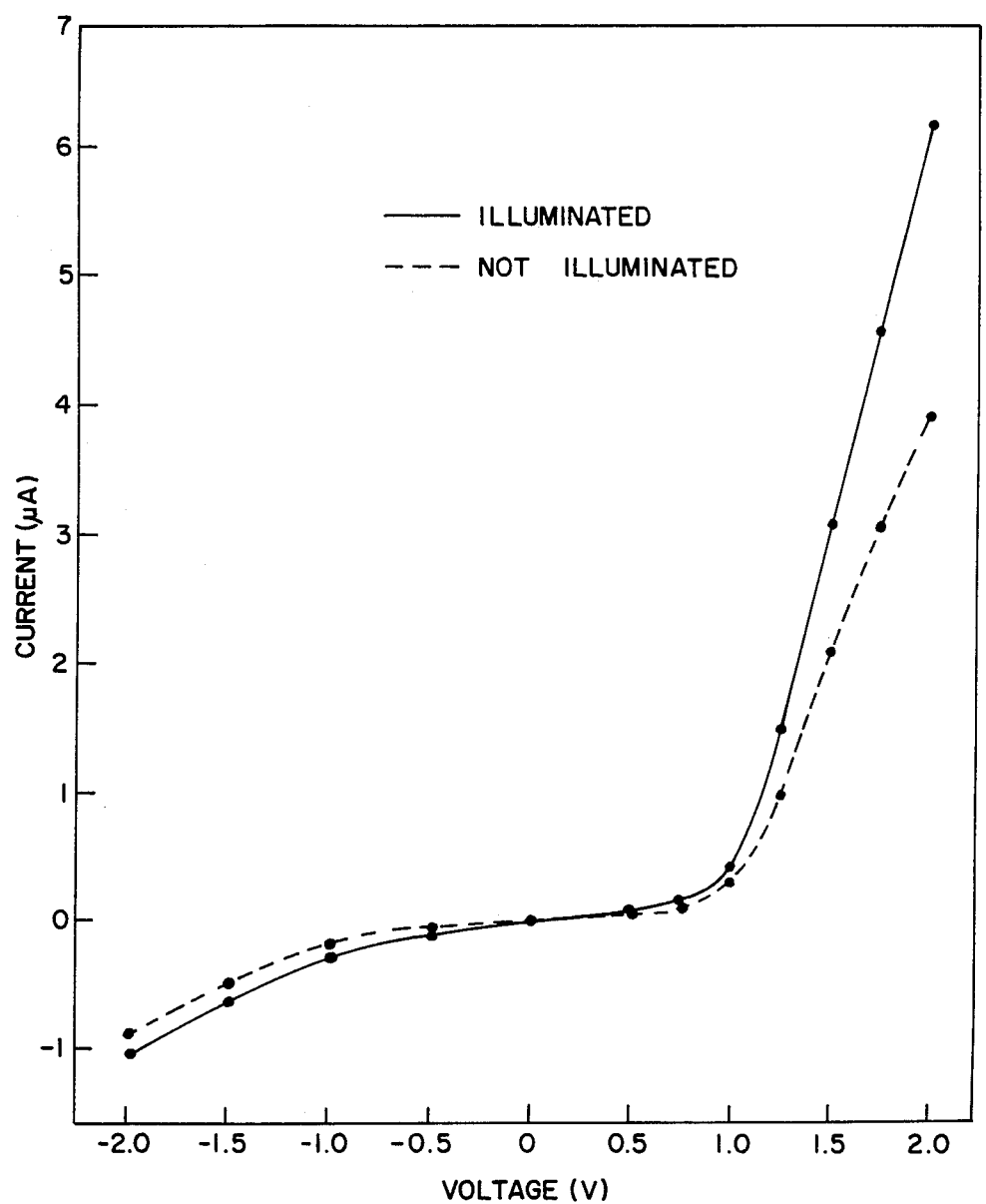
FIG. 4 is an example of the current-voltage characteristic of a device at 77 K with illumination of $10^{-8}$ W of near infrared radiation.

For preliminary testing, the device was mounted on a copper block and submerged in a bath of liquid nitrogen. The device was illuminated with approximately $10^{-8}$ W of broadband near-infrared radiation. A 2700° C. source with a GaAs filter was used. The dc current-voltage curve of the device is shown in FIG. 4. The responsitivity at an applied bias of 2 V was estimated at 200 A/W. The device exhibited a high photoconductive gain and correspondingly long response time, similar to that found in the extrinsic photoconduction devices.

When a free-carrier absorption occurs, exciting an electron out of a quantum well, it is accelerated by a field of approximately $10^4$ V/cm and has a capture probability for succeeding wells which can be deduced from the photoconductive gain to be approximately one part in $10^4$. The structure is then left with a unit positive charge. Since the carrier density is low in the GaAlAs region near the initial barrier, which is the edge of the first quantum well, the field from the excess charge extends into this layer and reduces the effective barrier height. The current rises above its dark level due to the increased thermionic emission over the initial barrier. This continues until an electron is captured, neutralizing the excess charge. Between the initial absorption and the eventual electron capture, an average of approximately $10^4$ electrons pass through the structure. Thus the photoconductive gain is large, approximately $10^4$, but the device response time is approximately one second, this being the average time between a photon absorption and the final electron capture. This effect is similar to that found in extrinsic photoconductive detectors.

Figure 5A:
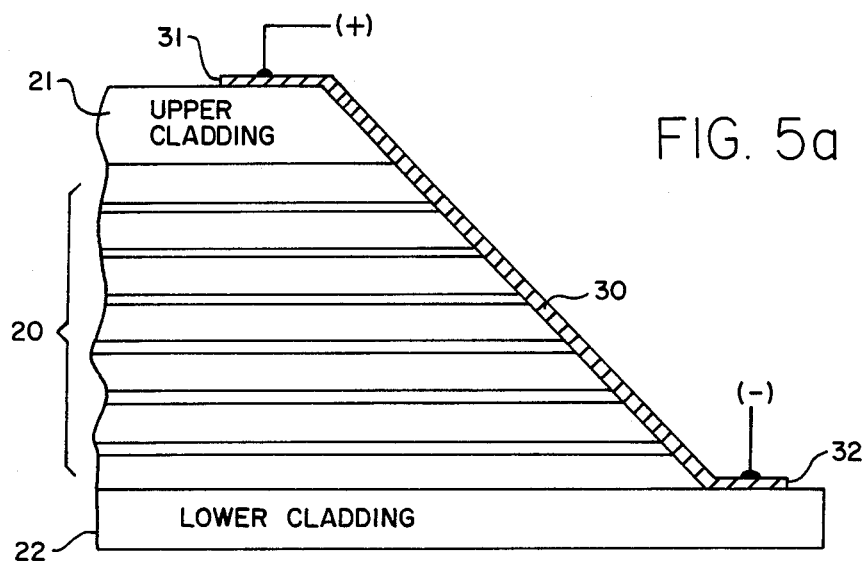
FIG. 5a illustrates the manner in which contact can be made to the trapping layers of a quantum-well structure, forming a resistive bias voltage divider which allows the use of avalanche multiplication.
Figure 5B:
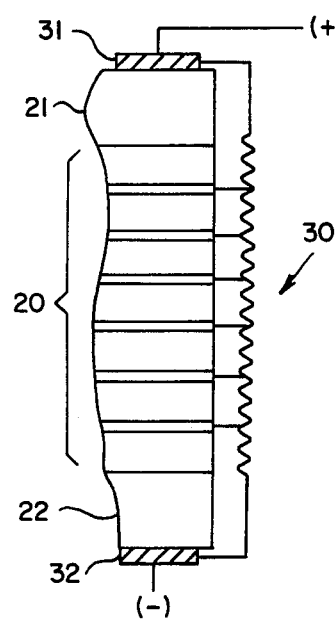

Another effect of importance is an avalanche mechanism, where electrons propagating through the structure elastically scatter from electrons trapped within the wells, transferring enough energy to allow them to escape the well. Unlike the typical Auger avalanche process, no holes are released, and the noise increase, which results if they are not prevented from participating in the avalanche process, is completedly avoided. Unlike extrinsic photoconductors, contact can be made to the trapping structures, which allows this process to be used for signal amplification, a process analogous to amplification in a photomultiplier tube. FIG. 5a illustrates the quantum-well heterojunction structure 20 of FIG. 3a cut on one side at an angle in order to make contact with the N+GaAs layers by depositing a strip of metal having finite resistance per unit length on the sloping side from an upper contact pad 31 to a lower contact pad 32. This arrangement provides voltage dividing resistance between the N+GaAs layers, as shown schematically in FIG. 5b.

Figure 5C:
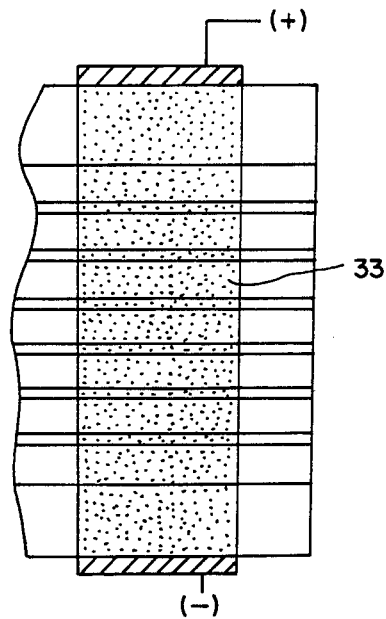

FIG. 5c shows a second method for providing this resistor divider structure, using a particle beam implantation in a column to mix the layers together, followed by a partial annealing. This forms a column 33 of homogeneous resistive material in ohmic contact with each quantum-well layer which provides the necessary distributed resistance schematically illustrated in FIG. 5b.

In order to isolate photodetector cells using this avalanche mechanism in an array, with the voltage dividing contact on one sloping side, it would be possible to extend the isolation channel down through only the first one or first few top quantum-well layers.

It is to be noted that the layers are highly conductive in the transverse direction, so that only one resistive biasing voltage divider is necessary for the entire array. The array should be illuminated from the bottom, through the substrate which is transparent to the IR radiation. Contacts to the individual isolated cells may then be made through the top, with a separate MOSFET switch for each cell to read out the array of cells individually one at a time using one time shared operational amplifier to sense the photocurrent of each cell or one MOSFET switch for each cell and one row of operational amplifiers to read out the array of cells one row at a time. Still other arrangements for implementing an array of photodetector cells will occur to those skilled in the art. The absorption events create free electrons near the bottom of the structure which initiates avalanches of electrons toward the upper contacts. The electrons are then stored due to the inherent capacitance of the device, and on any additional capacitance provided, until the charge can be read out by the scanning mechanism. The scanning mechanism can be similar to those used for dynamic semiconductor memories.

Devices in which avalanche is the important gain mechanism should have response times on the order of the transit time of the device, which is very short.

The probability for capture of high-energy electrons by a quantum well is one of the important parameters of the device, determining the photoconductive gain and the response time. This probability can be adjusted during the growth by varying the width of the quantum wells, with a wider well allowing electrons to thermalize and be captured by the well before making it across.

Potential advantages of this device structure include the increased efficiency of the device over the Schottky-barrier device due to elimination of absorption far from the interface which does not contribute to the detected current, and the built-in electric field on each of the quantum wells due to the separation of the electrons from their parent donors in the barrier region that increases the likelihood that excited carriers will escape the well region, which also increases the efficiency. The small transit time for such a device structure implies that the potential speed is very high, since the energetic carrier lifetime can be made short by increasing the width of the quantum wells.

The high degree of transparency of the structure for electrons allows the fabrication of devices with a thick quantum well structure, which would be needed in the surface detecting geometry due to the long absorption length. This, together with the GaAs/GaAlAs construction which would allow integration with other electronic devices such as amplifiers and multiplexers, is necessary for the construction of large two-dimensional arrays.

Using a surface detecting geometry and very large scale integrated circuit techniques allows the fabrication of large two-dimensional arrays. The circuitry for reading out pixels from the cells may consist of one MOSFET switch for each detector cell, as shown in FIG. 1b. With each of the cells being biased sequentially by the same source using circuitry to turn on the MOSFET switches sequentially, it is possible to have only one operation amplifier time shared by all the detector cells. Alternatively, it would be possible to provide operational amplifiers for each column of detectors, and then arrange the read-out control circuit to enable one row to be read at a time.

The device of the present invention has flexibilities not found in other infrared detectors, including tailoring of the cutoff wavelength, which may allow the fabrication of devices which are useful in several bands of interest in the near and mid infrared. Fabrication in GaAs allows the possibility of the construction of large two-dimensional arrays. Analogous detectors can be constructed in which the role played by the electrons are described is taken by holes, in which case the semiconductor material would be heavily doped P type. The device is otherwise completely analogous.

What is claimed is:

1. An infrared detector comprised of a heavily doped multiple quantum-well structure consisting of alternating layers of two semiconductor materials which form heterojunctions with a conduction-band discontinuity of desired magnitude for a quantum well in one material between layers of the second material, all of said layers being uniformly doped for the same type of single carrier conductivity, and means for biasing said quantum-well structure comprising a resistive voltage divider to bias each layer of said one material at a progressively higher voltage to neutralize any charge created by propagation of carriers in the avalanche photocurrent, thereby allowing an increase in the detector bias into the avalanche gain regime.

2. An infrared detector comprised of a heavily doped multiple quantum-well structure consisting of alternating layers of two semiconductor materials which form heterojunctions with a conduction-band discontinuity of desired magnitude for a quantum well in one material between layers of the second material, and means for biasing said quantum-well structure comprising a resistive voltage divider to bias each layer of said one material at a progressively higher voltage, thereby allowing an increase in the detector bias into the avalanche gain regime, said resistive divider being comprised of a column through all of said layers of quantum-well material that has been bombarded with particles and then partially annealed to produce a material in said column that has distributed resistivity.

* * * * *